US007952451B2

(12) United States Patent
Beerwerth

(10) Patent No.: US 7,952,451 B2
(45) Date of Patent: May 31, 2011

(54) HIGH-PASS FILTER

(75) Inventor: Wolfgang Beerwerth, Steinenbronn (DE)

(73) Assignee: Telegaertner Karl Gaertner GmbH, Steinenbronn (DE)

( * ) Notice: Subject to any disclaimer, the term of this patent is extended or adjusted under 35 U.S.C. 154(b) by 194 days.

(21) Appl. No.: 12/316,575

(22) Filed: Dec. 10, 2008

(65) Prior Publication Data

US 2009/0153270 A1 Jun. 18, 2009

(30) Foreign Application Priority Data

Dec. 11, 2007 (DE) ......................... 10 2007 061 413

(51) Int. Cl.
*H03H 7/01* (2006.01)

(52) U.S. Cl. ......................... 333/175; 333/168; 333/206

(58) Field of Classification Search .................. 333/168, 333/175, 181, 185, 206, 207, 243
See application file for complete search history.

(56) References Cited

U.S. PATENT DOCUMENTS

| | | | | |
|---|---|---|---|---|
| 3,167,729 | A | 1/1965 | Hall | |
| 3,238,469 | A | 3/1966 | Stankey et al. | |
| 3,506,936 | A * | 4/1970 | Loos et al. | 333/181 |
| 3,602,848 | A | 8/1971 | Leonard | |
| 5,894,251 | A | 4/1999 | Taguchi et al. | |
| 6,566,985 | B2 * | 5/2003 | Niiranen et al. | 333/202 |

FOREIGN PATENT DOCUMENTS

| | | |
|---|---|---|
| DE | 32 07 422 | 9/1983 |
| DE | 697 28 215 | 12/1997 |
| EP | 0 521 739 | 1/1993 |
| FR | 888 760 | 12/1943 |
| FR | 53 848 | 9/1946 |
| WO | 94/28592 | 12/1994 |
| WO | 2005/086275 | 9/2005 |

OTHER PUBLICATIONS

Toyoda, Sachihiro, "Low-Pass and High-Pass Filters Using Coaxial-Type Dielectric Resonators," International Journal of Infrared and Millimeter Waves, No. 11, pp. 1745-1755, Nov. 13, 1992.

* cited by examiner

*Primary Examiner* — Robert Pascal
*Assistant Examiner* — Kimberly E Glenn
(74) *Attorney, Agent, or Firm* — Lipsitz & McAllister, LLC

(57) ABSTRACT

The invention relates to a high-pass filter comprising a signal line with several capacitors connected in series as well as a ground line, wherein several inductors are connected between the signal line and the ground line. In order to configure the high-pass filter as a coaxial construction it is suggested in accordance with the invention that the signal line form an inner conductor and the ground line an outer conductor of a coaxial conductor, between which an insulation layer is arranged, and that the inductors be designed as discrete components which are arranged at a distance to one another and between which at least one impedor is connected.

22 Claims, 4 Drawing Sheets

HIGH-PASS FILTER

The present disclosure relates to the subject matter disclosed in German application number 10 2007 061 413.8 of Dec. 11, 2007, which is incorporated herein by reference in its entirety and for all purposes.

BACKGROUND OF THE INVENTION

The invention relates to a high-pass filter comprising a signal line with several capacitors connected in series as well as a ground line, wherein several inductors are connected between the signal line and the ground line.

High-pass filters of this type are used, for example, in telecommunications, in particular, in mobile radio communications. They can be connected, for example, between an antenna and a signal processing device and ensure that signals within a first range of frequencies with a relatively low frequency are attenuated to a considerable extent whereas, on the other hand, signals within a second range of frequencies with a relatively high frequency experience only a minimal attenuation. As a result, the signals of the first range of frequencies can be practically faded out.

High frequency signals are normally transmitted with the aid of coaxial lines which have an inner conductor and an outer conductor surrounding the inner conductor, wherein an insulation layer is arranged between the inner conductor and the outer conductor. In conjunction with the configuration of a low-pass filter, with which signals with a relatively low frequency experience only a very slight attenuation whereas, on the other hand, signals with a high frequency are subject to a very considerable attenuation and are, therefore, practically faded out, it has already been suggested in DE 32 07 422 A1 that additional elements be pushed onto the inner conductor which determine the distance between the inner conductor and the insulation layer, increase the capacitance of the inner conductor and, therefore, form a capacitor between the inner conductor and the outer conductor while, on the other hand, the inner conductor itself form an inductor in the area between two additional elements which increase capacitance. As a result, a low-pass filter can be designed as a coaxial construction in a constructionally simple manner.

The object of the invention is to configure a high-pass filter of the type specified at the outset as a coaxial construction.

SUMMARY OF THE INVENTION

This object is accomplished in accordance with the invention, for a high-pass filter of the generic type, in that the signal line forms an inner conductor and the ground line an outer conductor of a coaxial conductor, between which an insulation layer is arranged, and that the inductors are designed as discrete components arranged at a distance to one another and at least one impedor is connected between them.

In the case of the high-pass filter according to the invention, at least two inductors are used which are designed as discrete, electrical components, via which the inner conductor is electrically connected to the outer conductor. In order to ensure that the inductors do not influence one another to any great extent, they are arranged at a distance to one another with at least one impedor connected between them. In addition to the inductors and the at least one impedor, at least two capacitors are used which are connected in series to one another in the inner conductor. The high-pass filter according to the invention therefore has at least two LC elements connected in series as well as, in addition, at least one impedor which ensures a decoupling of the two inductors and is connected in series to the capacitors. It has been shown that, as a result, a high-pass filter can be designed as a coaxial construction in a constructionally simple manner.

At least one inductor is preferably designed as a spiral coil. This can extend, proceeding from the inner conductor, radially outwards in the direction towards the outer conductor. In this respect, it may be provided for the outer end of the spiral coil to be connected directly to the outer conductor so that a galvanic connection exists between the spiral coils and the outer conductor.

It is of particular advantage with a view to an inexpensive design of the high-pass filter when the inductors are of an identical design with respect to their electrical and/or mechanical properties.

The at least one impedor arranged between the inductors is preferably designed as a line section of the inner conductor. Discrete, electrical components for the purpose of making impedance available can be omitted, as a result.

A further reduction in the production and assembly costs is achieved in one advantageous development in that the capacitors connected in series relative to one another in the inner conductor are of an identical design with respect to their electrical and/or mechanical properties.

It is particularly favorable when the capacitors are designed as plate or tubular capacitors. Tubular capacitors have at least one tubular or sleeve-like, electrically conductive layer as well as a dielectric, which is likewise of a tubular or sleeve-like design, which enclose an additional, electrically conductive layer.

It has proven to be advantageous when the high-pass filter has at least one Pi-type element with a pair of inductors which are connected between the inner and the outer conductors, wherein a first capacitor, an impedor and a second capacitor are connected in series relative to one another in the inner conductor between the two inductors.

The two capacitors of the at least one Pi-type element are preferably of an identical design with respect to their electrical and/or mechanical properties. It may, be provided, in particular, for the two capacitors of the at least one Pi-type element to be designed as plate or tubular capacitors.

The impedor connected between the two capacitors of the at least one Pi-type element is preferably designed as a line section of the inner conductor.

It is of advantage when the line section of the inner conductor connecting the two capacitors of the Pi-type element to one another has a front and a rear, electrically conductive contact sleeve which accommodates a dielectric insulating sleeve, in which, on the other hand, an end piece of an additional line section of the inner conductor engages. A contact sleeve in combination with an insulating sleeve and an end piece of an additional line section forms each time one of the two capacitors of the Pi-type element which are connected in series relative to one another.

In this respect, it is particularly favorable when the front and the rear contact sleeves are connected in one piece to the line section of the inner conductor which connects to one another the two capacitors which are connected in series relative to one another. As a result, the assembly of the high-pass filter can be simplified.

In one preferred embodiment of the high-pass filter according to the invention, this has two Pi-type elements which are connected to one another via an impedor. Each of the two Pi-type elements has two respective inductors which are connected to one another via two capacitors and one impedor.

The impedor connecting the two Pi-type elements to one another is favorably designed as a line section of the inner conductor.

It is of particular advantage when the two Pi-type elements are of an identical design with respect to their electrical and/or mechanical properties since, as a result, the production and assembly costs of the high-pass filter can be reduced.

In order to improve the slope steepness of the high-pass filter, it is favorable when a capacitor is connected in series between at least one inductor and the outer conductor. The inductor forms a series resonance circuit in combination with the capacitor connected in series. This makes it possible to attenuate signals very considerably in the range of the resonance frequency of the series resonance circuit.

A capacitor is preferably connected between each inductor and the outer conductor. As a result, a galvanic connection can be avoided between the inductors and the outer conductor. This, on the other hand, leads to a simplification of the mechanical construction of the high-pass filter.

The avoidance of a galvanic connection between the inductors and the outer conductor has, in addition, the advantage that a connection for feeding in and/or tapping a supply or control voltage can be made available between at least one inductor and the capacitor connected in series to it. As a result, not only a high frequency information signal, in particular, a communication or data signal can be transmitted via the high-pass filter but, in addition, a supply voltage, in particular, a DC voltage or also a control voltage can also be fed in or tapped. A signal for the digital remote control of an antenna can, in particular, be used as a control voltage. Such a signal can be fed in and/or tapped at a junction point between an inductor and the capacitor connected in series to it. For this purpose, it is merely necessary to dimension the capacitor connected in series to the inductor in such a manner that it represents a high resistance between the inductor and the outer conductor with respect to the supply and/or control voltage which is of a low frequency in comparison with the information signals.

The high-pass filter can preferably be inserted into a coaxial transmission line, for example, by means of plug connectors or also by means of cable ports or a combination of the two.

The high-pass filter according to the invention preferably has a rigid housing part which is formed by the outer conductor. The housing part is preferably manufactured from metal.

The insulation layer arranged between the inner conductor and the outer conductor lines the housing part on the inner side, at least in sections, in one preferred embodiment. The insulation layer can be produced, for example, from a PTFE material (polytetrafluoroethylene material).

In order to keep the production and assembly costs of the high-pass filter according to the invention low, it is favorable when the insulation layer forms a dielectric of at least one capacitor which is connected in series to an inductor.

It is particularly favorable when at least one inductor of the high-pass filter forms a spacer between the inner conductor and the outer conductor. The use of additional spacers, via which the inner conductor is arranged concentrically to the outer conductor and at a distance to it, can at least be reduced as a result.

The high-pass filter according to the invention is preferably used for transmitting mobile radio communications signals. In this respect, it may be provided for signals in the range of 800 MHz to approximately 960 MHz to be subject to attenuation of more than 30 dB by means of the high-pass filter, in particular, attenuation of at least 40 dB whilst, on the other hand, mobile radio communications signals in the range of 1700 MHz and 2700 MHz are practically subject to no attenuation.

The following description of one preferred embodiment of the invention serves to explain the invention in great detail in conjunction with the drawings.

DETAILED DESCRIPTION OF THE INVENTION

Figure 1:
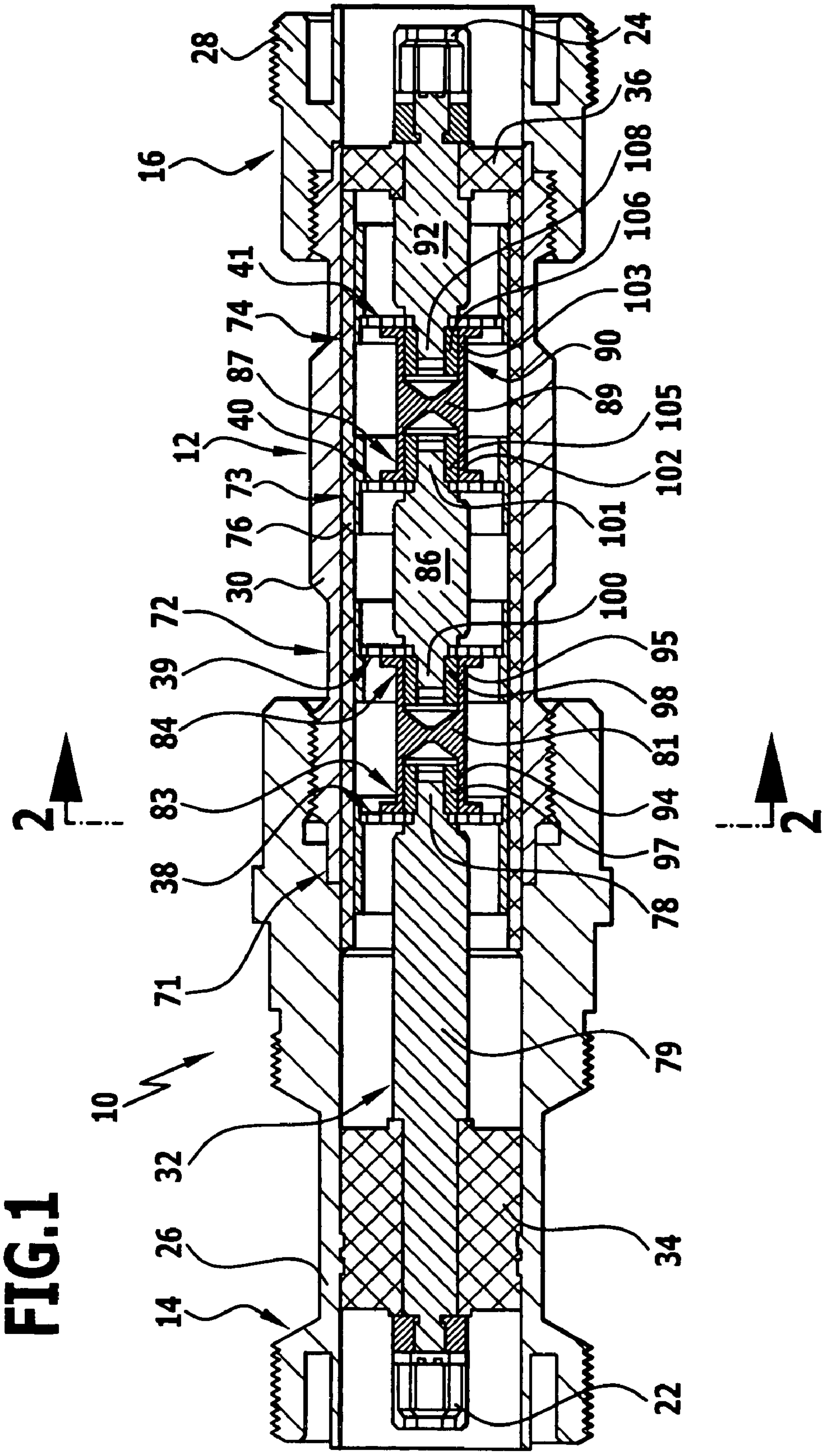
FIG. 1: shows a longitudinal section of a high-pass filter.

FIG. 1 is a schematic illustration of a longitudinal section of a high-pass filter which is given, altogether, the reference numeral 10 and has a central filter part 12 as well as a plug connector 14 on the input side and a plug connector 16 on the output side. The plug connector 14 on the input side is connected to the signal input 18 of the filter part 12 illustrated in FIG. 3 and the plug connector 16 on the output side is connected to the signal output 20 of the filter part 12 illustrated in FIG. 3. The two plug connectors 14 and 16 have a central insert contact 22 and 24, respectively, which is enclosed by a contact sleeve 26 and 28, respectively. The filter part 12 can be connected via the plug connector 14 on the input side to an input line which is known per se and not, therefore, illustrated in the drawings and which can, for example, provide a connection between a mobile radio communications antenna and the filter part 12. The signal received can be filtered with the aid of the filter part 12 and, subsequently, supplied, for example, to a signal receiver via the plug connector 16 on the output side and an output line which can be connected to it in the customary manner.

The filter part 12 has a sleeve-like housing 30 which is screwed, on the one hand, to the contact sleeve 26 on the input side and, on the other hand, to the contact sleeve 28 on the output side. A water-tight connection between the filter part 12 and the plug connectors 14, 16 on the input and output sides can be provided by means of sealing elements which are known per se and not illustrated in the drawings, for example, by means of sealing rings.

The high-pass filter 10 is designed as a coaxial construction, wherein the contact sleeves 26 and 28 on the input and output sides form, in conjunction with the housing 30, an outer conductor which can, for example, be grounded and represents a ground line. The contact sleeves 26, 28 on the input and output sides and the housing 30 accommodate a central inner conductor 32 which connects the insert contact 22 on the input side to the insert contact 24 on the output side and is insulated electrically from the contact sleeves 26, 28 and the housing 30. In order to ensure a distance between the inner conductor 32 and the contact sleeves 26, 28 and the housing 30, the inner conductor 32 is held at a distance to the contact sleeve 26 on the input side and to the housing 30 in the areas adjoining the insert contacts 22 and 24 by a supporting sleeve 34 and 36, respectively, which is produced from an electrically insulating material. Additional spacers in the form of spiral coils 38, 39, 40, 41 are used within the filter part 12 and will be described in greater detail in the following.

Figure 3:
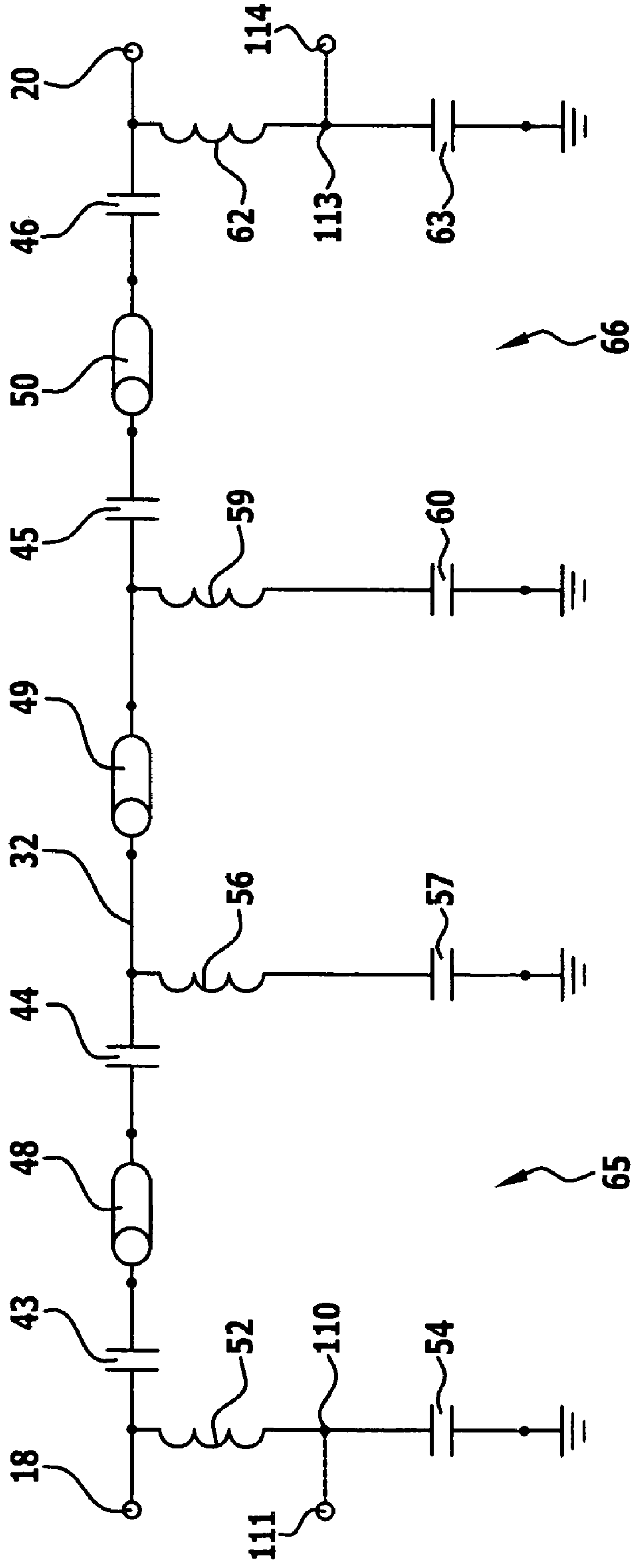
FIG. 3: shows a circuit diagram of the high-pass filter of FIG. 1.

An electrical circuit diagram of the filter part 12 is illustrated in FIG. 3. It is apparent from this that the inner conductor 32 connects the signal input 18 to the signal output 20, wherein a first and a second capacitor 43 and 44, respectively, as well as a third and a fourth capacitor 45 and 46, respectively, are connected in series to one another in the inner conductor 32 and wherein a first impedor 48 is connected between the first capacitor 43 and the second capacitor 44, a second impedor 49 between the second capacitor 44 and the third capacitor 45 and a third impedor 50 between the third capacitor 45 and the fourth capacitor 46. In the area between the signal input 18 and the first capacitor 43, a first inductor 52 branches off from the inner conductor 32 and this is connected to the housing 30 of the filter part 12 via a fifth capacitor 54, wherein the housing 30, as already explained, forms the grounded outer conductor of the high-pass filter 10. A second inductor 56 branches off from the inner conductor 32 in the area between the second capacitor 44 and the second impedor 49 and is connected electrically to the housing 30 functioning as outer conductor via a sixth capacitor 57.

In the area between the second impedor 49 and the third capacitor 45, a third inductor 59 branches off from the inner conductor 32 and is likewise connected to the housing 30 via a seventh capacitor 60. A fourth inductor 62 branches off from the inner conductor 32 in the area between the fourth capacitor 46 and the signal output 20 and is connected electrically to the grounded housing 30 via an eighth capacitor 63.

The filter part 12 therefore forms a first Pi-type element 65 and a second Pi-type element 66 which are connected to one another via the second impedor 49. The first Pi-type element 65 is formed by the first and the second inductors 52, 56 and the fifth and sixth capacitors 54, 57 connected in series to them as well as by the first and second capacitors 43, 44 and the first impedor 48 connected between them. The second Pi-type element 66 is formed by the third and fourth inductors 59, 62 and the seventh and eighth capacitors 60, 63 connected in series to them as well as by the third and fourth capacitors 45, 46 connected in series to one another and the third impedor 50 connected between them.

The first to fourth capacitors 43, 44, 45, 46 are of an identical configuration from an electrical point of view and also from a mechanical point of view—further details will be given in the following. They each have a value of several pF. The first to fourth inductors 52, 56, 59 and 62 are also of an identical design from an electrical point of view and also from a mechanical point of view. They each have a value of several nH.

Figure 4:
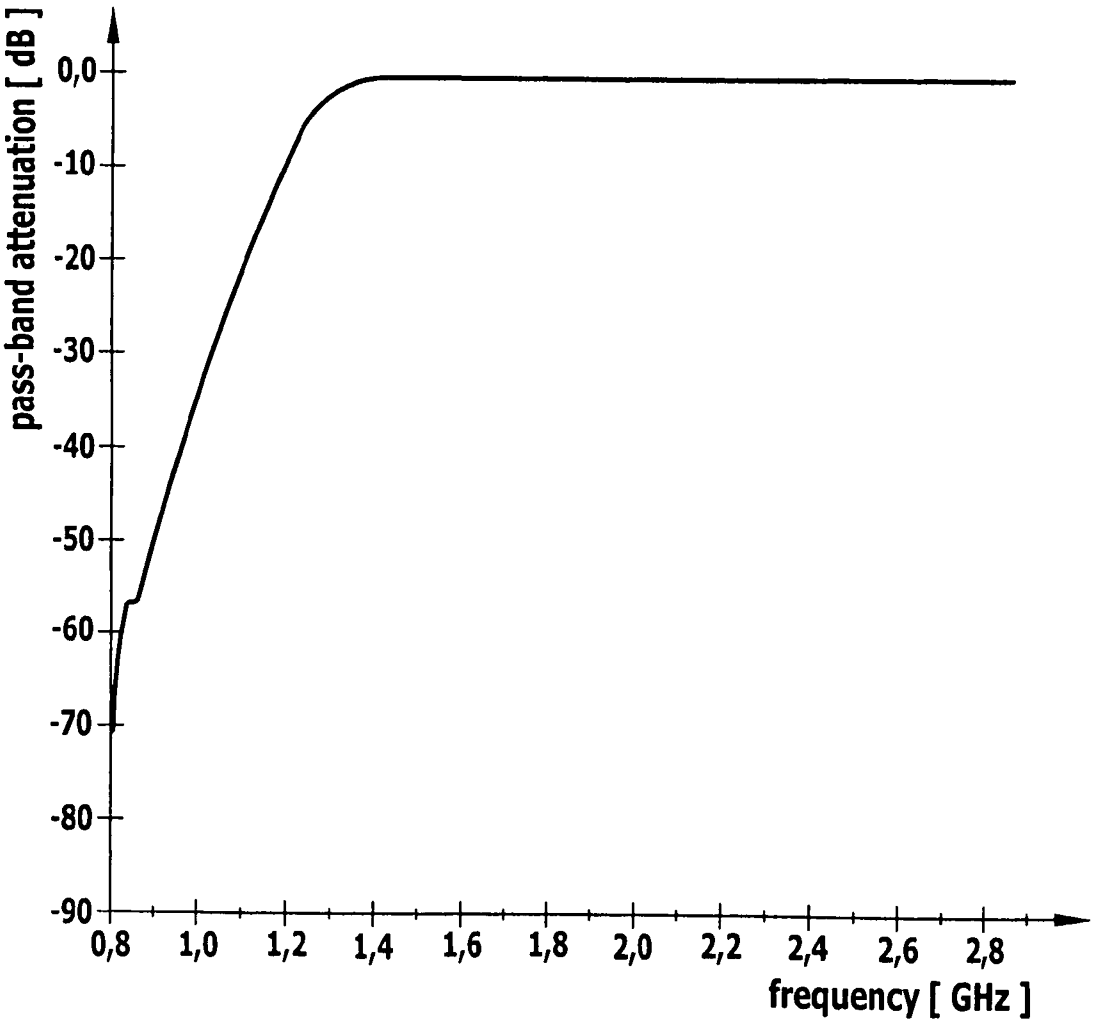
FIG. 4: shows a representation of the pass-band attenuation of the high-pass filter from FIG. 1 as a function of the frequency of an electrical signal to be transmitted.

If a high frequency signal is fed to the signal input 18, it experiences a varying attenuation as a function of its frequency. This is illustrated schematically in FIG. 4 which shows the pass-band attenuation between the signal input 18 and the signal output 20 as a function of the frequency of the signal. It becomes clear that signals with a frequency of more than 1.4 GHz experience practically no attenuation whereas, on the other hand, signals with a frequency of less than 1.4 GHz are subject to a quite considerable attenuation. As a result, signals with, for example, frequencies in the range of 0.8 to 1.0 GHz can be practically faded out whereas, on the other hand, signals with frequencies in the range of 1.7 to 2.7 GHz can pass through the high-pass filter 10 unhindered.

Figure 2:
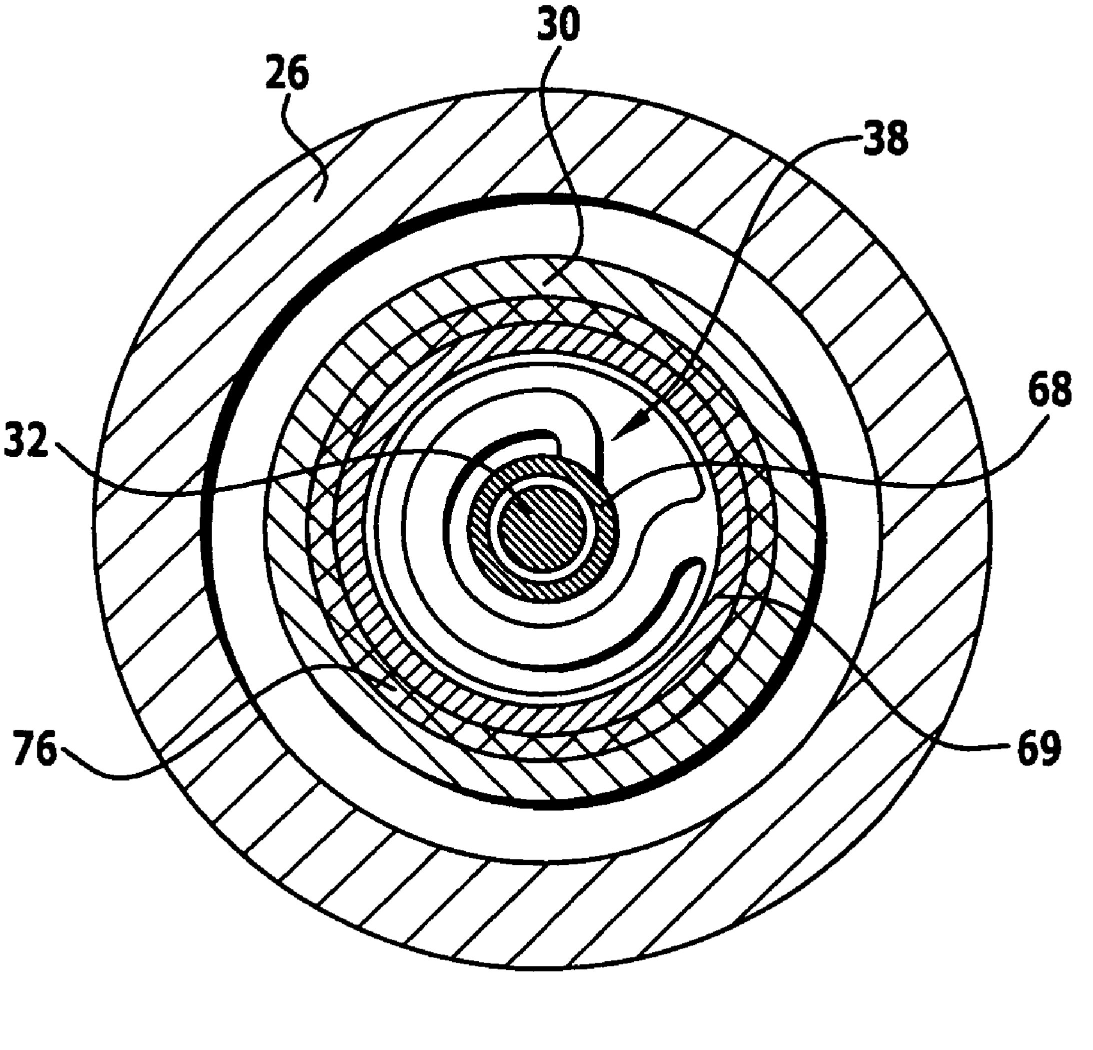
FIG. 2: shows a sectional view along line 2-2 in FIG. 1.

The inductors 52, 56, 59 and 62 are formed by the spiral coils 38, 39, 40 and 41, respectively, which have already been mentioned above with respect to their function of ensuring distance. They are of an identical design and each form discrete electrical components which are arranged at a distance to one another in order to avoid any electrical influence on one another. The construction of the coils 38 to 41 is apparent, in particular, from FIG. 2. Proceeding from an inner sleeve 68 enclosing the inner conductor 32 in a circumferential direction, they extend in a spiral shape as far as an outer sleeve 69, wherein they extend in a plane aligned at right angles to the inner conductor 32. The outer sleeve 69 forms not only the outer contact of the spiral shape coils 38, 39, 40 and 41 but it also represents, at the same time, a first contact electrode of the capacitors 54, 57, 60 and 63, respectively, which are connected in series to the respective coils 38, 39, 40 and 41. These capacitors are each designed as tubular capacitors 71, 72, 73 and 74, respectively, wherein the internal contact electrode of the tubular capacitors 71, 72, 73, 74 is formed by the outer sleeve 69 and the external contact electrode by the housing 30. An insulation layer 76 which lines the housing 30 and, therefore, represents the dielectric of the tubular capacitors 71 to 74, extends between the outer sleeves 69 and the housing 30.

A rear end piece 78 of an input section 79 of the inner conductor 32, which electrically connects the insert contact 22 on the input side to the inner sleeve 68 of the first coil 38, the end piece facing away from the insert contact 22 on the input side, passes through the inner sleeve 68 of the first coil 38. The input section 79 is followed by a first intermediate section 81 of the inner conductor 32 with a tubular capacitor 83 connected therebetween which forms the first capacitor 43 and the construction of which will be explained in greater detail in the following. The first intermediate section 81 is followed by a connecting section 86 of the inner conductor 32 with an additional tubular capacitor 84, which forms the second capacitor 44 and is of an identical design to the tubular capacitor 83, connected in between and the connecting section 86 is connected electrically to a second intermediate section 89 of the inner conductor 32 via a tubular capacitor 87 which forms the third capacitor 45 and is of an identical design to the tubular capacitors 83 and 84. The second intermediate section 89 is followed by an output section 92 of the inner conductor 32 via an additional tubular capacitor 90 which forms the fourth capacitor 46 and is of an identical design to the tubular capacitors 83, 84 and 87. The insert contact 24 on the output side is connected to the output section 32.

The first intermediate section 81 of the inner conductor 32 forms the first impedor 48 and is connected in one piece to a front contact sleeve 94 as well as to a rear contact sleeve 95 which accommodate a front insulating sleeve 97 and a rear insulating sleeve 98, respectively. The rear end piece 78 of the input section 79 engages in the front insulating sleeve 97 and a front end piece 100 of the connecting section 86 engages in the rear insulating sleeve 98. The rear end piece 78 of the input section 79 forms the tubular capacitor 83, which represents the first capacitor 43, in combination with the front insulating sleeve 97 and the front contact sleeve 94.

The connecting section 86 has a front end piece 100 which faces the first intermediate section 81 and a rear end piece 101 which faces the second intermediate section 89. The front end piece 100 engages in the rear insulating sleeve 98 which is enclosed by the rear contact sleeve 95. The front end piece 100 therefore forms the tubular capacitor 84, which represents the second capacitor 44, in combination with the rear insulating sleeve 98 and the rear contact sleeve 95.

The second intermediate section 89 is of an identical configuration to the first intermediate section 81 of the inner conductor 32. The second intermediate section 89 is also connected in one piece to a front contact sleeve 102 and a rear contact sleeve 103 which accommodate a front insulating sleeve 105 and a rear insulating sleeve 106, respectively. The rear end piece 101 of the connecting section 86 engages in the front insulating sleeve 105 and, therefore, forms the tubular capacitor 87, which represents the third capacitor 45, in combination with the front insulating sleeve 105 and the front contact sleeve 102. A front end piece 108 of the output section 92 engages in the rear insulating sleeve 106 and forms the tubular capacitor 90, which represents the fourth capacitor 46, in combination with the rear insulating sleeve 106 and the rear contact sleeve 103.

The first intermediate section 81 forms the first impedor 48, the connecting section 86 forms the second impedor 49 and the second intermediate section 89 forms the third impedor 50. The high-pass filter 10 can, therefore, be produced and assembled in a constructionally simple manner, wherein it is ensured that the inductors 52, 56, 59 and 62 designed as discrete electrical components are arranged at a distance to one another in the form of the spiral coils 38, 39, 40 and 41, wherein an impedor 48, 49 and 50, respectively, which is formed by a line section of the inner conductor 32, is arranged each time between the coils 38, 39, 40, 41. The high-pass filter 10 can, in this, way, be designed in a coaxial configuration, wherein signals with a frequency greater than 1.4 GHz are conveyed from the signal input 18 to the signal output 20 practically without being attenuated whereas, on the other hand, signals with a frequency of less than 1.4 GHz are subject to a considerable attenuation.

In FIG. 3, an addition to the circuit diagram is illustrated by dashed lines in accordance with an additional, advantageous embodiment of the high-pass filter in that a junction point 110 is provided between the first inductor 52 and the fifth capacitor 54 connected in series to it and a connection 111 can be connected to this junction point for feeding in and/or tapping a supply or control voltage. In a corresponding manner, a junction point 113 is also provided between the fourth inductor 62 and the eighth capacitor 63 connected in series to it and a connection 114, via which a supply or control voltage can likewise be fed in or tapped, can be connected to this junction point. For example, a supply voltage can be connected to or tapped at the connections 111 and/or 114 and supplied to an amplifier. In the same way, control signals, in particular, signals for controlling an antenna can also be fed in or tapped by means of the connections 111 and 114. This is possible because it is ensured by means of the capacitors 54, 57, 60 and 63 connected in series to a respective inductor 52, 56, 59, 62 that no galvanic connection exists between the inner conductor 32 and the grounded housing 30 which takes over the function of an outer conductor.

What is claimed is:

1. High-pass filter comprising:

a signal line with several capacitors connected in series, a ground line, several inductors connected between the signal line and the ground line, the signal line forming an inner conductor and the ground line forming an outer conductor of a coaxial conductor, and an insulation layer arranged between the inner conductor and the outer conductor, wherein:

the inductors are designed as discrete components arranged at a distance to one another, at least one impedor is connected between the inductors, and the capacitors connected in series relative to one another in the inner conductor are designed to be identical with respect to at least one of their electrical and mechanical properties.

2. High-pass filter as defined in claim 1, wherein at least one of the several inductors is designed as a spiral coil.

3. High-pass filter as defined in claim 1, wherein the inductors are designed to be at least one of electrically and mechanically identical.

4. High-pass filter as defined in claim 1, wherein the at least one impedor is designed as a line section of the inner conductor.

5. High-pass filter as defined in claim 1, wherein the capacitors connected in series relative to one another in the inner conductor are designed as plate or tubular capacitors.

6. High-pass filter as defined in claim 1, further comprising:

at least one Pi-type element formed by a pair of the inductors connected between the inner conductor and the outer conductor, and a first of the capacitors, a first of the at least one impedors and a second of the capacitors connected in series relative to one another in the inner conductor between the pair of the inductors.

7. High-pass filter as defined in claim 6, wherein the first and the second of the capacitors are designed as plate or tubular capacitors.

8. High-pass filter as defined in claim 6, wherein the first of the at least one impedors connected between the first and the second of the capacitors is designed as a line section of the inner conductor.

9. High-pass filter as defined in claim 8, wherein the line section has a front and a rear electrically conductive contact sleeve, each of the sleeves accommodating a dielectric insulating sleeve, an end piece of an additional line section of the inner conductor engaging in said insulating sleeve.

10. High-pass filter as defined in claim 9, wherein the front and rear contact sleeves are connected in one piece to the line section connecting the first and the second of the capacitors to one another.

11. High-pass filter as defined in claim 6, wherein:

the at least one Pi-type element comprises two Pi-type elements connected to one another via a second of the at least one impedors.

12. High-pass filter as defined in claim 11, wherein the second of the at least one impedors is designed as a line section of the inner conductor.

13. High-pass filter as defined in claim 11, wherein the two Pi-type elements are of an identical design with respect to at least one of their electrical and mechanical properties.

14. High-pass filter as defined in claim 1, wherein an additional capacitor is connected in series between at least one of the inductors and the outer conductor.

15. High-pass filter as defined in claim 14, wherein a connection for at least one of the feeding in and tapping of a supply or control voltage is arranged between at least one of the inductors and the additional capacitor connected in series to it.

16. High-pass filter as defined in claim 1, wherein the high-pass filter is adapted to be inserted into a coaxial transmission line.

17. High-pass filter as defined in claim 1, wherein the outer conductor forms a rigid housing part of the high-pass filter.

18. High-pass filter as defined in claim 17, wherein the insulation layer lines the housing part on an inner side at least in sections.

19. High-pass filter as defined in claim 18, wherein the insulation layer forms a dielectric of at least one additional capacitor connected in series to a corresponding one of the inductors.

20. High-pass filter as defined in claim 1, wherein at least one of the inductors forms a mechanical spacer between the inner conductor and the outer conductor.

21. High-pass filter comprising:

a signal line with several capacitors connected in series, a ground line, several inductors connected between the signal line and the ground line, the signal line forming an inner conductor and the ground line forming an outer conductor of a coaxial conductor; and an insulation layer arranged between the inner conductor and the outer conductor, wherein:

the inductors are designed as discrete components arranged at a distance to one another, at least one impedor is connected between the inductors, and the at least one impedor is designed as a line section of the inner conductor.

22. High-pass filter comprising:

a signal line with several capacitors connected in series, a ground line, several electrically and mechanically identical inductors connected between the signal line and the ground line, the signal line forming an inner conductor and the ground line forming an outer conductor of a coaxial conductor, and an insulation layer arranged between the inner conductor and the outer conductor, wherein:

the inductors are designed as discrete components arranged at a distance to one another, at least one impedor is connected between the inductors, the capacitors connected in series relative to one another in the inner conductor are designed to be identical with respect to their electrical and mechanical properties, at least one Pi-type element is formed by a pair of the inductors connected between the inner conductor and the outer conductor, and a first of the capacitors, one of the at least one impedors and a second of the capacitors connected in series relative to one another in the inner conductor between the pair of the inductors, and an additional capacitor is connected in series between each of the inductors and the outer conductor, a connection for at least one of the feeding in and tapping of a supply or control voltage is arranged between at least one of the inductors and the additional capacitor connected in series to it.

* * * * *